United States Patent [19]

Sakagami et al.

[11] Patent Number: 5,202,158
[45] Date of Patent: Apr. 13, 1993

[54] APPARATUS FOR AND METHOD OF PRODUCING HIGH DENSITY FIBER REINFORCED COMPOSITE MATERIAL

[75] Inventors: Seigou Sakagami; Makoto Kawase; Satoshi Wakamatsu, all of Hyogo; Kouichi Iwata, Osaka; Tadafumi Adschiri, Miyagi, all of Japan

[73] Assignee: Sumitomo Electric Industries, Ltd., Osaka, Japan

[21] Appl. No.: 689,306

[22] Filed: Apr. 22, 1991

Related U.S. Application Data

[63] Continuation-in-part of Ser. No. 530,232, May 30, 1990, abandoned.

[30] Foreign Application Priority Data

May 31, 1989 [JP] Japan ................................ 1-139846

[51] Int. Cl.⁵ ............................................. C23C 16/46
[52] U.S. Cl. ................................... 427/185; 427/213; 427/255.1; 427/255.2; 427/255.6; 118/715; 118/719; 118/725; 118/728
[58] Field of Search ............... 427/213, 255.6, 255.1, 427/255.2, 185; 118/715, 719, 725, 728

[56] References Cited

U.S. PATENT DOCUMENTS 4,895,108 1/1990 Caputo .............................. 427/255.2

FOREIGN PATENT DOCUMENTS 0188270 7/1986 European Pat. Off. .

OTHER PUBLICATIONS

Condit, Am. Ceramic Soc. Bul. vol. 66, No. 2, (1987) pp. 359–362.
Stinton, Am Ceramic Soc. Bul. vol. 67, No. 2 (1988) pp. 350–355.
Stinton, Am Ceramic Soc. Bul. vol. 65, No. 2 (1986) pp. 347–350.
Ceram. Eng. Sci. Proc. vol. 6, pp. 694–706 (1985) by A. J. Caputo et al.

Primary Examiner—Richard Bueker
Attorney, Agent, or Firm—W. G. Fasse; D. H. Kane, Jr.

[57] ABSTRACT

An apparatus and a method of producing a high density fiber reinforced composite material operate for lowering the porosity of a porous fiber reinforced composite material. A large number of particles arranged in a reaction tube are pushed up by the pressure of gases flowing from a gas inlet port toward a gas outlet port to enter floating states and to collide with the porous fiber reinforced composite material which is fixed in the reaction tube. In this state, matricies are formed in pores of the porous fiber reinforced composite material through chemical vapor infiltration. The large number of floating particles prevent an adhesion between the surface of the porous fiber reinforced composite material and blocking with soot, while preventing the pores from blocking with soot.

11 Claims, 3 Drawing Sheets

APPARATUS FOR AND METHOD OF PRODUCING HIGH DENSITY FIBER REINFORCED COMPOSITE MATERIAL

CROSS-REFERENCE TO RELATED APPLICATION

The present application is a continuation-in-part Application of our then copending U.S. patent application Ser. No.: 07/530,232; filed on May 30, 1990, now abandoned.

FIELD OF THE INVENTION

The present invention relates to an apparatus for and a method of producing a high density fiber reinforced composite material, and more specifically, it relates to an apparatus for and a method of producing a high density fiber reinforced composite material by forming matricies in pores of a porous fiber reinforced composite material through chemical vapor infiltration (CVI), thereby lowering the porosity of the porous fiber reinforced composite material. Such a high density fiber reinforced composite material is applied to a heat resisting structural material such as the external wall of a space shuttle or the first wall of a nuclear fusion reactor, brake lining, or the like.

BACKGROUND INFORMATION

In general, a fiber reinforced composite material of high porosity such as a carbon fiber reinforced carbon composite material has been reduced in porosity by a method such as resin (pitch) impregnation, CVD (chemical vapor deposition), pressure impregnation carbonization or the line, as described in "Tanso Sen-i Sangyo" by Ken-ichi Morita, Kindai Henshu-sha, pp. 176-178. In such a method, however, infiltration or a matrix raw material into a base material for the composite material is so limited that the interior of the base material may remain highly porous because of the difficulty in infiltrating of the matrix material, although porosity of a part around the surface layer of the base material can be lowered by impregnation of the matrix material. While in a resin impregnation method it may be possible to use a resin of low viscosity for impregnation into the interior of the base material for the composite material, such a resin of low viscosity is so inferior in yield upon carbonization that it is impossible to lower the porosity of the base material as a whole.

Ceram. Eng. SCI. PROC. Vol. 6, pp. 694-706 (1985) discloses a technique of lowering the porosity, which has been recently watched with interest. According to the method disclosed in this literature, matricies are formed through CVI in pores of a porous fiber reinforced composite material having a matrix made of carbon or ceramics such as SiC, $Si_3N_4$, $SiO_2$, TiC, $Al_2O_3$, $B_4C$, TiN, BN or the like, thereby lowering the porosity of the porous fiber reinforced composite material.

FIG. 1 is a sectional view illustrating an apparatus for producing a high density fiber reinforced composite material, which is disclosed in the above literature. This apparatus comprises a reaction tube 1 having a gas inlet port and a gas outlet port, and a heater 4 for heating the reaction tube 1. A porous fiber reinforced composite material 3 is held on the inner wall surface of the reaction tube 1 by a holder 2. A reactive gas and a carrier gas are introduced into the reaction tube 1 from the gas inlet port, passed through the porous fiber reinforced composite material 3, and discharged to the exterior from the gas outlet port.

FIG. 2 is a partially enlarged sectional view showing a process of forming matricies 6 in pores 5 of the porous fiber reinforced composite material 3. Methyltrichlorosilan gas ($CH_3Cl_3Si$) is employed as a reactive gas for forming the matricies 6, and gaseous hydrogen ($H_2$) is employed as a carrier gas for adjusting the density of the reactive gas. In this case, the methyltrichlorosilan gas is decomposed into silicon carbide and hydrogen chloride in accordance with the following reaction formula, so that silicon carbide is deposited in pores 5 of the porous fiber reinforced composite material 3 to define the matricies 6, as shown in FIG. 2:

$$CH_3Cl_3Si + H_2 \rightarrow SiC + 3HCl + H_2$$

Such decomposition of the methyltrichlorosilan gas is mainly caused when molecules of the methyltrichlorosilan gas collide with the porous fiber reinforced composite material 3. In addition, the methyltrichlorosilan gas is also decomposed when molecules of the reactive gas collide with each other in the gaseous phase. Decomposition products formed in the gaseous phase float as soot grains 7, and adhere onto the surface of the porous fiber reinforced composite material 3. Consequently, openings of the pores 5 exposed on the surface of the porous fiber reinforced composite material 3 are covered with the soot grains 7, such that diameters thereof are reduced. Thus, decomposition of the reactive gas, which is caused by collision of the reactive gas and the porous fiber reinforced composite material 3, mainly takes place on the surface of the porous fiber reinforced composite material 3. In other words, the matricies 6 are formed only on the surface of the porous fiber reinforced composite material 3, and hardly formed in its interior.

In order to sufficiently form the matricies 6 in pores which are provided in the interior of the porous fiber reinforced composite material 3, it is necessary to intermittently scrape off a layer of the soot grains 7 adhering onto the surface of the porous fiber reinforced composite material 3. Such an excess step is unpreferable in view of production efficiency.

SUMMARY OF THE INVENTION

It is an object of the present invention to provide an apparatus for producing a high density fiber reinforced composite material, which can sufficiently lower the porosity of a porous fiber reinforced composite material up to its interior by preventing adherence between the surface thereof and soot.

Another object of the present invention is to provide a method of producing a high density fiber reinforced composite material, which can efficiently lower the porosity of a porous fiber reinforced composite material by preventing its surface from adhering to soot.

The apparatus of the invention for producing a high density fiber reinforced composite material is adapted to lower the porosity of a porous fiber reinforced composite material by forming matricies in pores of the porous fiber reinforced composite material through chemical vapor infiltration, and comprises a reaction tube, gas supply means, heating means, a large number of particles, and holding means. The reaction tube has a gas inlet port and a gas outlet port. The gas supply means supplies a reactive gas serving as a raw material for the matricies and a carrier gas through the gas inlet port. The heating means heats the reaction tube. The large number of particles, which are arranged in the reaction tube, are pushed up by the pressure of the gases flowing from the gas inlet port toward the gas outlet port, to float in the reaction tube for removing soot from the material surface. The holding means holds the porous fiber reinforced composite material to locate the same in the floating region of the particles within the reaction tube.

The method of the invention for producing a high density fiber reinforced composite material is adapted to lower the porosity of a porous fiber reinforced composite material by forming matricies in pores of the porous fiber reinforced composite material through chemical vapor infiltration, and comprises the steps of:

a. arranging a porous fiber reinforced composite material in a reaction tube having a gas inlet port and a gas outlet port;

b. arranging a large number of particles in the reaction tube;

c. introducing a reactive gas for serving as a raw material for matricies and a carrier gas into the reaction tube through the gas inlet port;

d. pushing up the large number of particles by the pressure of the gases flowing from the gas inlet port toward the gas outlet port to bring the same into floating states; and e. forming matricies in pores of the porous fiber reinforced composite material while striking the floating particles against the porous fiber reinforced composite material for removing soot therefrom.

According to the present invention, the following function and beneficial effect has been attained.

Soot grains, which are generated in the gaseous phase upon collision of molecules of the reactive gas, partially adhere to the surfaces of the floating particles. Therefore, the amount of the remaining soot grains, which adhere to the surface of the porous reinforced composite material, is reduced as compared with that in the conventional apparatus and method as described with reference to FIGS. 1 and 2. Further, the floating particles regularly collide with the surface of the porous fiber reinforced composite material, to scrape off the soot grains adhering to the said surface. Thus, it is possible to prevent adhesion of soot grains to the surface of the porous fiber reinforced composite material, the porosity is efficiently lower porosity of the porous fiber reinforced composite material up to its interior.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
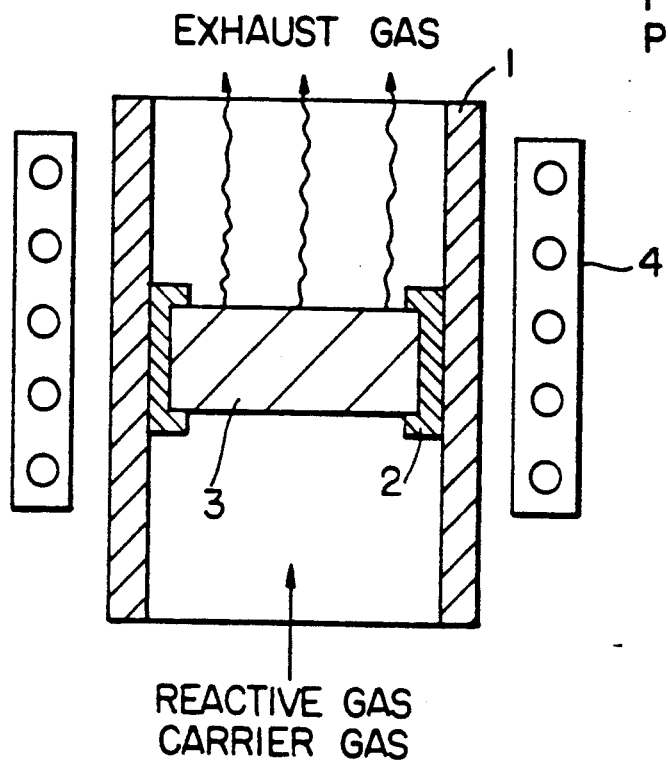
FIG. 1 is a sectional view illustrating a conventional apparatus for producing a high density fiber reinforced composite material.
Figure 2:
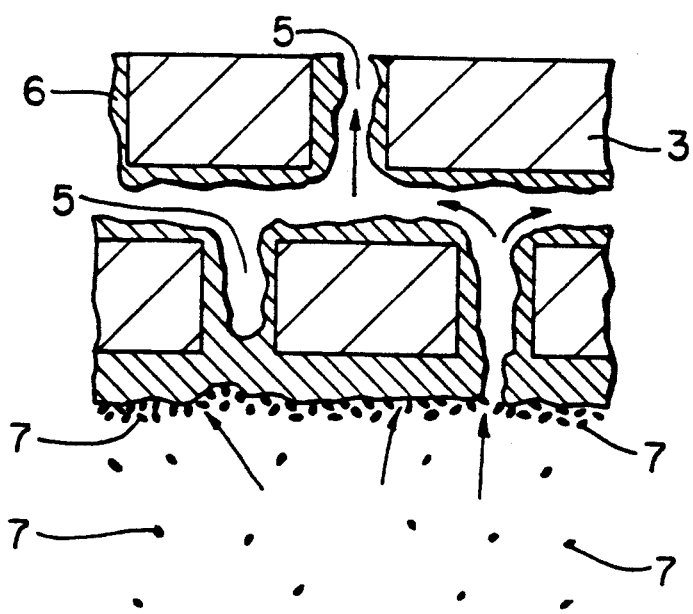
FIG. 2 is a partially enlarged sectional view illustrating a process of forming matricies in pores of the porous fiber reinforced composite material in the conventional apparatus.
Figure 3:
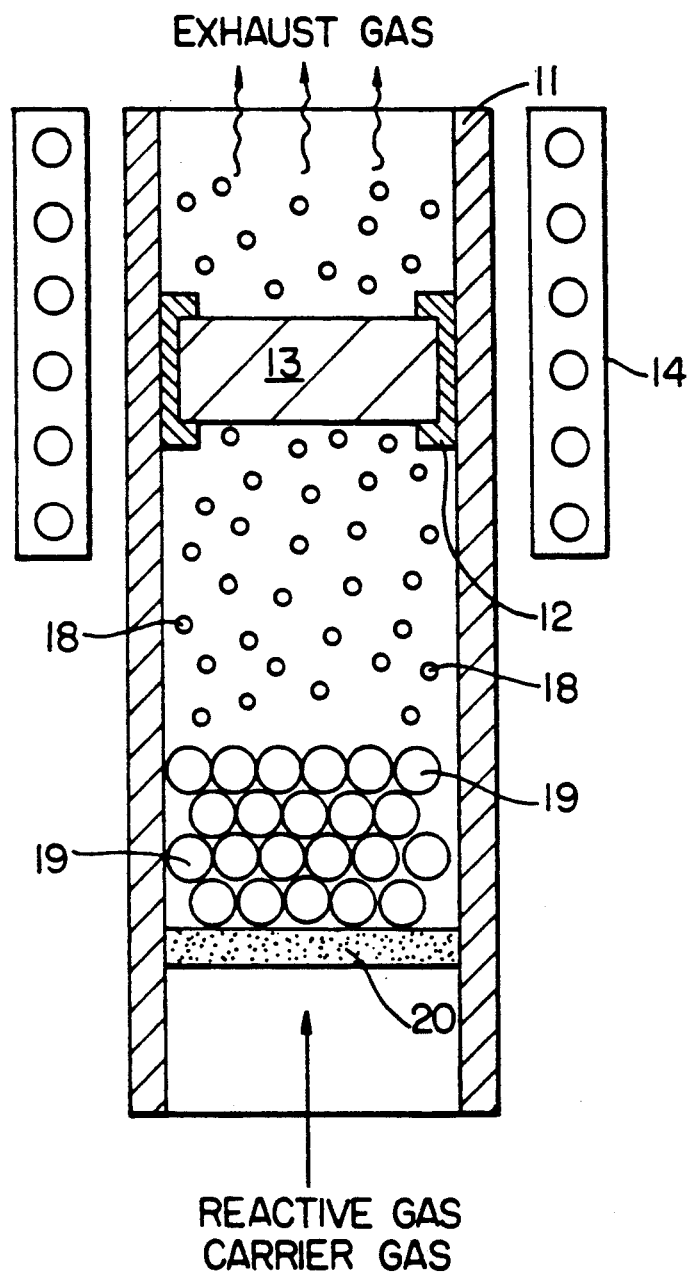
FIG. 3 is a sectional view illustrating an apparatus for producing a high density fiber reinforced composite material according to an embodiment of the present invention.

FIG. 3 shows an apparatus for producing a high density fiber reinforced composite material according to an embodiment of the present invention. This apparatus comprises a reaction tube 11 having a gas inlet port and a gas outlet port, and a heater 14 for heating the reaction tube 11. A porous fiber reinforced composite material 13 is fixedly held on the inner wall surface of the reaction tube 11 through a holder 12. Further, a fixed member 20, a large number of balls 19 and a large number of particles 18 are arranged in the reaction tube 11. The fixed member 20, which is made of a foam metal allowing passage of gases, for example, is fixed to the inner wall of the reaction tube 11. The balls 19 of ceramics, for example, are placed on the fixed member 20. The particles 18 are prepared from fine powder of ceramics, for example, preferably in particle diameters of 100 to 200 $\mu$m. The large number of particles 18 are supported by the balls 19 from below.

A reactive gas for serving as a raw material for matricies and a carrier gas are introduced into the reaction tube 11 through the gas inlet port. These gasses are passed through the fixed member 20, the balls 19, the particles 18 and the porous fiber reinforced composite material 13, and discharged toward the exterior from the gas outlet port. The reactive gas is prepared from propylene ($CH_3CHCH_2$), for example, while the carrier gas is prepared from nitrogen, for example.

The large number of particles 18 placed on the large number of balls 19 are pushed up by the pressure of the gases flowing from the gas inlet port toward the gas outlet port, to enter floating states. FIG. 3 shows such floating states of the large number of particles 18. The large number of floating particles 18 collide with the surface of the porous fiber reinforced composite material 13.

The reactive gas of propylene is decomposed in accordance with the following reaction formula, to form carbon. This carbon is deposited in pores of the porous fiber reinforced composite material 13 to form matricies, thereby increasing the density of the porous fiber reinforced composite material 13,

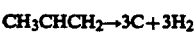

$$CH_3CHCH_2 \rightarrow 3C + 3H_2$$

Figure 4:
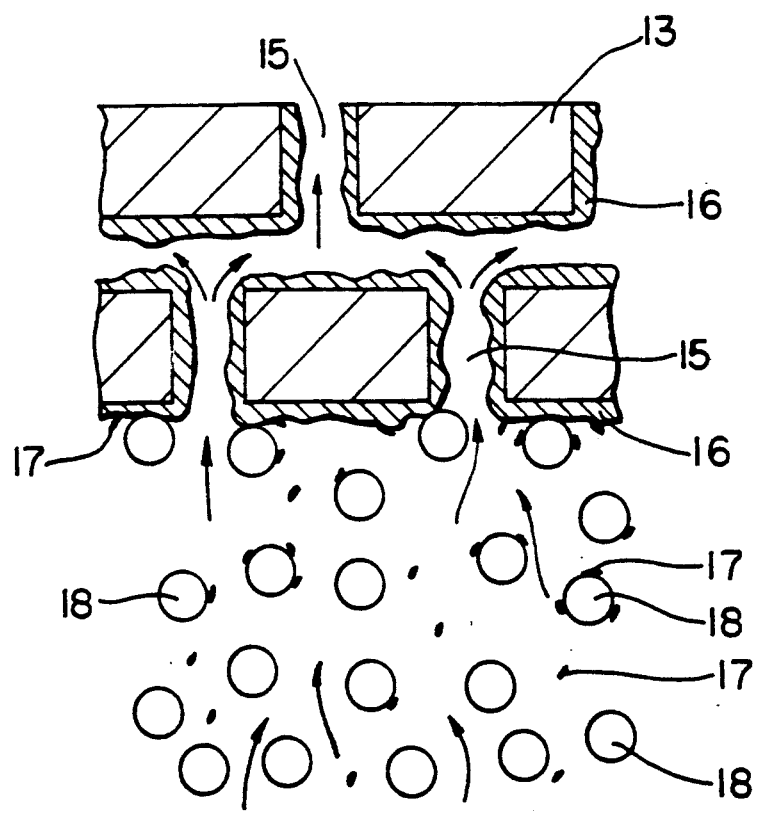
FIG. 4 is a partially enlarged sectional view illustrating a process of forming matricies in pores of a porous fiber reinforced composite material according to the present method.

With reference to FIG. 4, it will now be described that matricies 16 are efficiently formed in pores of the porous fiber reinforced composite material 13. The reactive gas of propylene is decomposed upon collision with the porous fiber reinforced composite material 13, to form carbon. This carbon is deposited in pores 15 of the porous fiber reinforced composite material 13, to form matricies. Also in the gaseous phase, molecules of the reactive gas collide with each other to form soot grains 17. Parts of floating soot grains 17 adhere onto the surfaces of the flowing particles 18. Therefore, the amount of remaining soot grains 17, which adhere onto the surface of the porous fiber reinforced composite material 13, is reduced. Further, the soot grains 17 adhering onto the surface of the porous fiber reinforced composite material 13 are scraped off by the floating particles 18, which regularly collide with said surface.

Thus, the adhesion between the surface of the porous fiber reinforced composite material 13 and soot grains 17 is prevented. Since openings of the pores 15, which are exposed to the surface of the porous fiber reinforced composite material 13, are not blocked by the soot grains 17, the reactive gas sufficiently flows into the interior of the porous fiber reinforced composite material 13, to form the matricies 16 in the interior pores 15. Consequently, it is possible to finally obtain a high density fiber reinforced composite material.

The porous fiber reinforced composite material preferably contains at least one material selected from a group of whiskers, short fibers, paper, felt, long fibers, nonwoven fabric, two dimensional woven fabric and three dimensional woven fabric material, as reinforcing fiber material. The reinforcing fiber material contains at least one material selected from a group of SiC, $Si_3N_4$, B, and carbon. Further, the porous fiber reinforced composite material preferably contains at least one element selected from a group of SiC, $Si_3N_4$, $SiO_2$, TiC, $Al_2O_3$, TiN, BN and carbon as a matrix.

Examples of the present invention are now described.

INVENTIVE EXAMPLE 1

(1) Quartz sand and a C/C (carbon/carbon) composite (□10×10 mm, porosity: 40%) were placed in a reaction tube. The C/C composite was fixed onto the inner wall surface of the reaction tube above the quartz sand.

(2) A mixture of gaseous propylene (reactive gas) and gaseous nitrogen (carrier gas) was introduced from a lower part of the reaction tube, to bring particles of the quartz sand into a floating state by the gas pressure. The moving particles of the quartz sand surrounded and collided with the C/C composite. In this state, CVI was performed at 800° C. for 10 hours.

(3) The C/C composite was extracted for measurement of porosity, which was 15%.

COMPARATIVE EXAMPLE 1

CVI was performed under conditions substantially similar to those of Example 1 according to the invention, except that no quartz sand was employed. The surface of a C/C composite used in this comparative example was covered with soot, and substantially no carbon matrix was formed in its interior.

INVENTIVE EXAMPLE 2

(1) Quartz sand and three dimensional woven carbon fiber (□10×10 mm, porosity: 60%) were placed in a reaction tube. The three dimensional woven carbon fiber was fixed to the inner wall of the reaction tube above the quartz sand.

(2) A mixture of silicon tetrachloride and methane was introduced from a lower part of the reaction tube for serving as a reactive gas, followed by introduction of nitrogen for serving as a carrier gas. The particles of the quartz sand were brought into floating states by the pressure of the introduced gases and the moving particles surrounded and collided with the three dimensional woven carbon fiber. In this state, CVI was performed at 500° C. for 20 hours.

The following reaction was caused in the reaction tube:

$$SiCl_4 + CH_4 \rightarrow SiC + 4HCl$$

(3) The three dimensional woven carbon fiber was extracted for observation. This fiber was converted to carbon fiber reinforced silicon carbide having a porosity of 20%.

COMPARATIVE EXAMPLE 2

CVI was performed under conditions substantially identical to those of Example 2 according to the invention, except that no quartz sand was employed. The surface of a three dimensionally woven carbon fiber was covered with soot, and substantially no silicon carbide was formed in its interior.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for producing a high density fiber reinforced composite material for lowering porosity of a porous fiber reinforced composite material by forming matricies in pores of said porous fiber reinforced composite material through chemical vapor infiltration, said apparatus comprising:
   a reaction tube having a gas inlet port and a gas outlet port;
   gas supply means for supplying a reactive gas for serving as a raw material for said matricies and a carrier gas into said reaction tube through said gas inlet port;
   heating means for heating said reaction tube;
   a large number of particles arranged in said reaction tube and pushed up by the pressure of said gases flowing from said gas inlet port toward said gas outlet port; and
   holding means for holding said porous fiber reinforced composite material in a floating region of said particles in said reaction tube,
   wherein said particles are adapted to strike against a surface of the porous fiber reinforced composite material and thereby remove soot from said surface.

2. The apparatus in accordance with claim 1, wherein said particles are prepared from ceramic fine powder of 100 to 200 μm in particle diameter.

3. The apparatus in accordance with claim 1, further comprising:
   a fixed member being fixed in said reaction tube for allowing passage of said gases; and
   a large number of balls arranged on said fixed member for supporting said large number of particles from below.

4. The apparatus in accordance with claim 1, wherein said porous fiber reinforced composite material contains at least one material selected from a group of whiskers, short fibers, paper, felt, long fibers, nonwoven fabric, two dimensional woven fabric and three dimensional woven fabric, as reinforcing fiber.

5. The apparatus in accordance with claim 1, wherein said porous fiber reinforced composite material contains at least one material selected from a group of SiC, $Si_3N_4$, B, and carbon, as reinforcing fiber.

6. The apparatus in accordance with claim 1, wherein said porous fiber reinforced composite material contains at least one element selected from a group of SiC, $Si_3N_4$, $SiO_2$, TiC, $Al_2O_3$, TiN, BN and carbon, as a matrix.

7. A method of producing a high density fiber reinforced composite material for lowering porosity of a porous fiber reinforced composite material by forming matricies in pores of said porous fiber reinforced composite material through chemical vapor infiltration, said method comprising the steps of:

arranging a porous fiber reinforced composite material in a reaction tube having a gas inlet port and a gas outlet port;

arranging a large number of particles in said reaction tube;

introducing a reaction gas for serving as a raw material for said matricies and a carrier gas into said reaction rube through said gas inlet port;

pushing up said large number of particles by the pressure of said gases flowing from said gas inlet port toward said gas outlet port for bringing the same into floating states; and forming matricies in pores of said porous fiber reinforced composite material while removing soot by striking said floating particles against said porous fiber reinforced composite material.

8. The method in accordance with claim 7, wherein said particles are prepared from ceramic fine powder of 100 to 200 $\mu m$ in particle diameter.

9. The method in accordance with claim 7, wherein said porous fiber reinforced composite material contains at least one material selected from a group of whiskers, short fibers, paper, felt, long fibers, non-woven fabric, two dimensional woven fabric and three dimensional woven fabric, as reinforcing fiber.

10. The method in accordance with claim 7, wherein said porous fiber reinforced composite material contains at least one material selected from a group of SiC, $Si_3N_4$, B, and carbon, as reinforcing fiber.

11. The method in accordance with claim 7, wherein said porous fiber reinforced composite material contains at least one element selected from a group of SiC, $Si_3N_4$, $SiO_2$, TiC, $Al_2O_3$, $B_4C$, TiN, BN and carbon, as a matrix.

* * * * *

UNITED STATES PATENT AND TRADEMARK OFFICE
CERTIFICATE OF CORRECTION

PATENT NO. : 5,202,158
DATED : April 13, 1993
INVENTOR(S) : Seigou Sakagami et al.

It is certified that error appears in the above-identified patent and that said Letters Patent is hereby corrected as shown below:

On the title page,
In the abstract [57], line 14, delete "blocking with",
line 15, replace "blocking with" by
--being blocked by--,
in claim 6, column 6, line 67, after "AL$_2$O$_3$" insert --B$_4$C--,
in claim 7, column 7, line 15, replace "rube" by --tube--.

Signed and Sealed this

Twenty-eighth Day of December, 1993

Attest:

BRUCE LEHMAN

Attesting Officer     Commissioner of Patents and Trademarks